(12) United States Patent
Martin et al.

(10) Patent No.: US 9,927,770 B2
(45) Date of Patent: Mar. 27, 2018

(54) HOLOGRAPHIC RECORDING COMPOSITION

(71) Applicant: Dublin Institute of Technology, Dublin (IE)

(72) Inventors: Suzanne Martin, Dublin (IE); Vincent Toal, Dublin (IE); Emilia Mihaylova, Dublin (IE); Izabela Naydenova, Dublin (IE); Dervil Cody, Dublin (IE)

(73) Assignee: Dublin Institute of Technology, Dublin (IE)

( * ) Notice: Subject to any disclaimer, the term of this patent is extended or adjusted under 35 U.S.C. 154(b) by 0 days.

(21) Appl. No.: 15/318,547

(22) PCT Filed: Jun. 26, 2015

(86) PCT No.: PCT/EP2015/065619
§ 371 (c)(1),
(2) Date: Dec. 13, 2016

(87) PCT Pub. No.: WO2016/001108
PCT Pub. Date: Jan. 7, 2016

(65) Prior Publication Data
US 2017/0123374 A1    May 4, 2017

(30) Foreign Application Priority Data

Jun. 30, 2014 (GB) .................. 1411640.4

(51) Int. Cl.
*G03H 1/00* (2006.01)
*G11B 7/24044* (2013.01)
(Continued)

(52) U.S. Cl.
CPC .......... *G03H 1/0011* (2013.01); *G03F 7/001* (2013.01); *G03F 7/027* (2013.01); *G03F 7/031* (2013.01); *G03H 1/0005* (2013.01); *G03H 1/02* (2013.01); *G03H 1/0402* (2013.01); *G11B 7/242* (2013.01); *G11B 7/24044* (2013.01); *G03H 2001/0016* (2013.01); *G03H 2001/0044* (2013.01);
(Continued)

(58) Field of Classification Search
None
See application file for complete search history.

(56) References Cited

U.S. PATENT DOCUMENTS 4,012,256 A * 3/1977 Levinos .................. G03F 7/031
                                                            430/281.1
2010/0167179 A1   7/2010  Martin
2012/0128608 A1   5/2012  Rodrigues

FOREIGN PATENT DOCUMENTS

GB         2439746 A       1/2008
WO    WO2006/008531 A1     1/2006

OTHER PUBLICATIONS

Naydenova et al., Photopolymers: Beyond the Standard Approach to Photosensitisation, Journal of the European Optical Society, Sep. 11, 2009.
(Continued)

*Primary Examiner* — Sanza Mcclendon
(74) *Attorney, Agent, or Firm* — McDonnell Boehnen Hulbert & Berghoff LLP

(57) ABSTRACT

A pressure sensitive holographic recording composition is described wherein the composition comprises diacetone acrylamide, glycerol and citric acid. The composition is capable of recording high diffraction efficiency reflection holograms.

20 Claims, 9 Drawing Sheets

(51) Int. Cl.
G03H 1/02 (2006.01)
G03H 1/04 (2006.01)
G11B 7/242 (2006.01)
G03F 7/00 (2006.01)
G03F 7/027 (2006.01)
G03F 7/031 (2006.01)

(52) U.S. Cl.
CPC . *G03H 2001/0415* (2013.01); *G03H 2240/22* (2013.01); *G03H 2260/12* (2013.01); *G03H 2260/30* (2013.01); *G03H 2260/50* (2013.01)

(56) References Cited

OTHER PUBLICATIONS

Cody et al., A Comparative Cytotoxic Evaluation of Acrylamide and Diacetone Acrylamide to Investigate Their Suitability for Holographic Photopolymer Formulations, International Journal of Polymer Science, 564319 (2013).

Mihaylova et al., Research on Holographic Sensors and Novel Photopolymers at the Centre for Industrial and Engineering Optics, Holography: basic principles and contemporary applications, Intech, 2013.

Cody et al., Effect of glycerol on a diacetone acrylamide-based holographic photopolymer material, Applied Optics 52(3), 2013.

Ren et al., Solvent-induced 25 changes in photochemical activity and conformation of photosystem particles by glycerol, Biol. Chem., 2006.

Bennett, Glycerol as sensitizer, J. Phys. Chem. 16, pp. 614-615, 1912.

Meyer et al. Photoactive yellow protein from the purple phototropic bacterium, Biophys. J. 56, pp. 559-564, 1989.

Galassi, Wavelength dependence of the time course of fluorescence enhancement and photobleaching during irradiation of ethidium bromide-stained nuclei, Eur. J. Basic Appl. Histochem. 44, 419-432, 2000.

PCT International Search Report and Written Opinion, PCT International Application No. PCT/EP2015/064619, dated Sep. 15, 2015.

Dervil Cody et al., Effect of glycerol on a diacetone acrylamide-based holographic photopolymer material, Centre for Industrial and Engineering Optics, 2013, pp. 1-10, Dublin Institute of Technology.

* cited by examiner

Composition A, 71 N/cm²  Composition B, 71 N/cm²  Composition C, 80 N/cm²

(a) (b) (c)

HOLOGRAPHIC RECORDING COMPOSITION

CROSS-REFERENCE TO RELATED APPLICATIONS

The present application is a U.S. national stage entry of PCT/EP2015/064619 filed Jun. 26, 2015, which claims priority to Great Britain Patent Application No. 1411640.4 filed on Jun. 30, 2014, the contents of each of which is hereby incorporated by reference.

FIELD

The present application relates generally to the field of holography. More particularly, the present application relates to holographic recording mediums and formulations for same. In an exemplary arrangement, the present application relates to a pressure sensitive recording material that is useable in holographic applications.

BACKGROUND OF THE INVENTION

Holography is well known and widely used in many commercial applications including display holography, security, advertising and holographic optical elements and gratings. A holographic image is produced when light is diffracted at a complex spatially varying diffraction grating, which, in the simplest terms, redirects the light towards the viewer in such a way as to give the illusion that the light is coming from a solid three-dimensional object.

This diffraction grating is produced by exposing a suitable photosensitive material to the optical interference pattern produced when two coherent light beams (usually produced by a laser) meet. The material records the variation in light intensity (as a variation in refractive index, absorption or thickness) and a corresponding diffraction grating results. If both light beams are simple collimated beams, the result will be a simple diffraction grating whose spatial period depends on the angle between the recording beams.

If the diffraction grating is illuminated with one of the recording beams (or a similar beam), it will diffract the light to reproduce the other recording beam. If one of the beams is a complex wave front coming from a three dimensional object, the recorded diffraction grating will have the property that it can reconstruct this wave front when illuminated with the other beam.

A wide variety of photosensitive materials are available which are suitable for recording holograms including photopolymers, silver halides, dichromated gelatin, photo resists, thermoplastics, photochromics and photo-refractive materials.

One of the biggest markets in the field of commercial holography is security holograms. Security holograms are commonly found on credit cards, bank notes, passports and concert tickets, for example and function as an authentication device.

In recent years, research has been carried out on the development of volume photopolymer holograms. The photopolymer phase reflection hologram is attractive for security holograms. Such a hologram is relatively thick by hologram standards, for example, of the order of tens of microns. This means that the diffraction efficiency can be very high which results in the production of eye-catching 3D images, visually quite different to the rainbow effect of the embossed hologram. A further feature of photopolymer reflection holograms is the capacity to angularly multiplex several holograms into one layer. In photopolymers with high refractive index modulation, this can produce a moving image effect. Even a small number of multiplexed holograms can enable toggling between two static images, so that text or warnings can be visible in conjunction with the holographic image. A further and advantageous characteristic of photopolymers is the broad range of wavelength sensitivity which enables several colour components in the hologram.

Another area of application of holograms is in sensors and sensing. Holograms that can change their optical properties when exposed to a change in their environment have been developed as holographic sensors. Holograms that are sensitive to a particular chemical substance such as heavy metal ions, alcohol in water, proton concentration or physical conditions such as humidity, temperature and pressure, for example, have been developed previously.

A holographic sensor that responded to pressure was reported in [C. R. Lowe, J. Blyth, and A. P. James, "Interrogation of a sensor," 2006]. An emulsion consisting of acrylamide:methacrylamide (2:1, v/v) and a crosslinker methylenebisacrylamide (5 mol %) was deposited on a substrate to create a film, which was then polymerised by a free radical polymerisation. Using silver-halide chemistry, a hologram was recorded while the substrate was soaking in a water bath using a frequency doubled Nd:YAG laser ($\lambda$=532 nm). The resulting hologram was sandwiched using another transparent substrate and pressure was applied onto the holograms using a pair of G-clamps. The pressure of the clamps on the hologram resulted in a contraction in the volume of the hologram, thus causing the diffraction signal to blue-shift by a total of 3 nm. While the above publication discusses the principle of operation of a pressure sensitive hologram, a shift of 3 nm in wavelength is not large enough to produce a visible change in the colour of the image reconstructed from the hologram, and implies that the sensitivity of the reported material to pressure is not large enough for pressure-sensing applications.

Despite developments in the field of holographic recording materials, there remains a need for improved holographic recording compositions for pressure sensing.

The present invention is directed towards providing improved formulations for the preparation of holographic recording materials and to the improved performance of photosensitive holographic recording materials for applications, such as pressure sensing, for example.

SUMMARY

In a first aspect, the present invention provides a holographic recording composition comprising diacetone acrylamide, citric acid and glycerol. Advantageously, the holographic recording composition is a pressure sensitive holographic recording composition. Accordingly, the present invention provides a holographic recording composition wherein the holographic recording composition is a pressure sensitive holographic recording composition wherein advantageously, a colour change occurs in an image reconstructed from a hologram recorded in the composition, following a change in pressure applied to the hologram.

Thus, the sensitivity to change in pressure is manifested by a change in the wavelength of the reconstructed light from the reflection hologram recorded in the composition of the present invention.

The pressure sensitive holographic recording composition described herein is capable of recording pressure sensitive holograms having a diffraction efficiency in the range from 25 to 40%, preferably in the range from 28 to 38% when recorded at a spatial frequency in the range of from 2500 to 3500 l/mm.

The holographic recording composition suitably further comprises a free radical generator, a photoinitiator and a binder. The composition described herein is capable of responding to environmental changes, such as pressure, for example.

The holographic recording composition according to the present teaching may comprise citric acid in an amount in the range from about 0.8% w/w to about 6% w/w; preferably in the range from 1.22% w/w to 4.89% w/w, most preferably in an amount of about 2.45% w/w.

The composition may comprise diacetone acrylamide in an amount in the range from about 8% w/w to about 30% w/w; preferably in the range from about 11% w/w to about 26% w/w.

The holographic recording composition may comprise glycerol in an amount in the range from about 8% w/w to about 35% w/w; preferably in the range from about 10.3% w/w to about 31.6% w/w.

The free radical generator may be selected from the group consisting of triethanolamine (TEA), Diethanolamine (DEA), Ethanolamine (EA), Trethlyamine (TETN), Diethylamine (DETN), and Ethylenediaminetetraacetic acid (EDTA).

Preferably, the free radical generator comprises triethanolamine. The triethanolamine may be present in an amount in the range of 20 to 45% w/w. The binder may be selected from the group consisting of PVA, polyvinylpirrolidone, polyethyleneoxide, polyethyleneglycol, polyethyloxizaline, a sol-gel, a hydrogel, and an acrylate.

The photoinitiator may be selected from the group consisting of methylene blue dye, erythrosine B, indocyanine green, Ethyl Eosine, Eosin Scarlet, Eosin Y, Rose Bengal, Phloxine B, Fluorescein, Methyl Blue, xanthene dyes, thionine dyes and quinine-imine dyes.

The holographic recording composition according to the present teaching may further comprise a cross-linking monomer selected from the group consisting of bisacrylamide, piperazine di-acrylamide, diallyltartardiamide, dihydroxyelthylene-bis-acrylamide, bis-acrylyleystamine.

The holographic recording composition described herein is pressure sensitive in the range of from 40 to 110 N/cm$^2$.

The inventors have surprisingly found that both citric acid and glycerol can be advantageously included in the holographic recording compositions of the present invention in order to record high diffraction efficiency holograms in reflection mode in the diacetone acrylamide-based photopolymer. The combined effect of glycerol and citric acid together with the diacetone acrylamide-based photopolymer, is to increase the diffraction efficiency of the recorded holograms from 10±2% (for compositions comprising either glycerol or citric acid) to 28±2% at a spatial frequency of 3050 l/mm. Holograms prepared using the composition according to the present invention ideally have a diffraction efficiency in the range 28-38% for spatial frequencies in the range from 2500 to 3500 l/mm. The maximum diffraction efficiencies achievable in this composition for the range of spatial frequencies of from 2500 to 4500 l/mm are 38% to 12%.

Thus, the compositions described herein allow a change in colour to be achieved using mechanical contraction or expansion of the hologram. Pressure sensitive photopolymers are compressed due to applied pressure, which causes a decrease in the recorded fringe spacing of the hologram, and consequently changes in the colour of the reconstructed image. The colour of the reconstructed image will change from red to yellow to green to blue as the applied pressure increases. The reverse colour changes occur when the hologram expands (i.e. as the pressure is reduced or removed entirely), and as the fringe spacing is thereby caused to increase.

The colour change in the image reconstructed from the hologram, recorded in the holographic recording compositions of the present invention, occurs following a change in the pressure applied to the hologram. This effect enables direct visualisation of pressure distribution as a colour map.

The holographic recording compositions of the present invention have the significant advantage of being pressure sensitive to pressure up to 6 GPa. This is a relatively high pressure and the holographic recording compositions of the present invention have the unexpected and surprising advantage of being able to survive such high pressure levels and retain the pressure sensitivity so that colour changes are still visible up to such high pressures.

The composition according to the present invention provides an environmentally friendly, low toxicity, pressure sensitive composition for recording holograms, in particular reflection holograms.

The present invention provides methods of producing pressure sensitive holograms made from photosensitive materials using compositions employing the monomer, Diacetone-acrylamide, together with citric acid and glycerol. The compositions of the present invention may further comprise other components including a dye, a free radical generator, a second monomer or cross linking monomer and a binder.

The compositions may be used in a range of applications including sensor applications, including for example, colour changing sensor applications, pressure sensors, deformation sensors, strain sensors, diffractive optics and in data storage.

In a further aspect, the present invention provides a holographic sensor comprising a holographic recording composition as described herein. The colour of the image reconstructed from the hologram changes with change in pressure applied to the holographic recording composition.

In a still further aspect, the present invention provides a hologram or holographic device or diffractive optical element wherein the spatial frequency of the hologram or parts of the hologram may be tuned by applying pressure before during or after the holographic exposure, or wherein local pressure is continuously varied, in order to alter the desired holographic characteristics of the hologram.

Another area of commercial application of holograms is the field of security. For example, security holograms which act as authentication devices for passports, credit cards, identification documents, labels, such as product labels, stamps, financial documents.

In a still further aspect, the present invention provides a security device comprising a hologram recorded in the holographic recording composition as described herein. The image reconstructed from the security device changes colour following application of pressure. For example, the security device may, after being signed using a stylus with which pressure is applied, produce a signature in a colour different from that of the background.

A further application of the composition described herein is in the preparation of individualised holograms. The individualisation of holograms can be carried out by a variety of different methods, for example, by typewriting on the top of a pressure sensitive polymer/photopolymer before recording a ologram/diffraction grating. Another example of a suitable method is by typewriting on the top of a pressure sensitive polymer/photopolymer after a hologram/diffraction grating has been recorded.

In one aspect, the present invention provides a method of producing the pressure sensitive hologram recording composition described herein wherein the composition comprises Diacetone-acrylamide, together with citric acid and glycerol, the method comprising the steps of holographic recording of a reflection hologram of spatial frequency ranging between 2500 and 4500 l/mm and utilizing recording intensity of from 2 to 6 mW/cm$^2$. As can be seen from FIG. 9 of the accompanying Figures, an efficiency of over 35% was achieved at a spatial frequency of 2500 l/mm and at a recording intensity of 5 to 6 mW/cm$^2$. The permeability of the photosensitive material is such that individualised holograms can be made using printing, stamping, spraying or any other suitable method of dye deposition, on the top of the diacetone-acrylamide polymer using the method generally discussed in the documents identified as references [1, 2] in the References listing appended hereto. A diacetone-acrylamide polymer/photopolymer with different pressure sensitivity can be used in combination with a non-pressure sensitive composition to produce a device with differential pressure response. A non-pressure sensitive composition is a composition which, in practice, does not respond to pressure or has a very low pressure sensitivity.

BRIEF DESCRIPTION OF THE DRAWINGS

The present application will now be described with reference to the accompanying drawings in which.

DETAILED DESCRIPTION OF THE DRAWINGS

The present invention relates to improved pressure sensitive holographic recording compositions of lower toxicity and environmental impact compared to known compositions for recording holograms, in particular pressure sensitive holograms. In particular, the present invention provides pressure sensitive holographic recording compositions comprising Diacetone-acrylamide. It has been found that inclusion of Diacetone-acrylamide in such compositions makes them more pressure sensitive.

The pressure sensitivity of the composition according to the present invention can be controlled by selection of appropriate additives. For example, the inclusion of glycerol has been found to increase the pressure sensitivity of the compositions. In addition, the reversibility of the colour change due to pressure can be controlled by modification of the holographic recording composition.

The composition described herein is suitable for use for recording Denisyuk-type reflection holograms.

The composition enables the recording of reflection holograms which have the ability to produce colour maps of pressure distribution without the need for scanning and digital processing. The operating principle is that the colour of the reconstructed light from a reflection hologram illuminated by ambient light, depends on the pressure to which the hologram has been subjected. This principle derives from the fact that the hologram is made of elastic photopolymer, which compresses under pressure, in turn reducing the recorded interference fringe spacing and increasing the average refractive index, and hence reducing the resonant wavelength of the device. When a reflection hologram is illuminated with white light, it operates as a Bragg mirror and light of a specific colour is diffracted and this is the colour observed. For example, if a red laser is used to record the reflection hologram then the reconstructed image will be observed in red, assuming negligible shrinkage or swelling occurs during recording.

Pressure sensitive photopolymers compress under applied pressure, which leads to a change in the recorded fringe spacing of the hologram, and consequently to a change in the colour observed in reconstruction. As the pressure increases, the colour changes; specifically, as the pressure increases, the colour changes in a predetermined sequence of colours.

A range of pressure sensitivity may be achieved in a controllable manner for different applications. For example, the pressure sensitivity may be varied by adding different additives that can change the compressibility of the composition.

The pressure sensitivity of the composition can also be varied by preparing photopolymer layers of different thicknesses.

Figure 1:
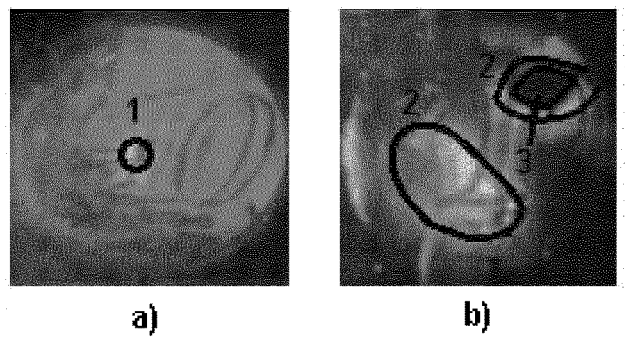
FIG. 1 is an image of Denisyuk-type reflection hologram recorded in a diacetone acrylamide-based photopolymer film, under a respective pressure of, in FIG. 1(a), 44 N/cm$^2$ and, in FIG. 1(b), 71 N/cm$^2$. The parts of the image reconstructed from the hologram indicated by reference numerals 1, 2 and 3 are coloured yellow, green and blue respectively, due to the application of increasing pressure. The colour changes from red to yellow to green to blue as the applied pressure increases. The colour changes occur in reverse, i.e. from blue to green to yellow to red, when the hologram expands (i.e. as the applied pressure is reduced), causing the recorded fringe spacing to increase; The composition of the photopolymer (composition B) is described in Table 1.

With reference to FIG. 1, the results demonstrate that reconstructed images from reflection holograms made using the pressure-sensitive holographic recording compositions according to the present teaching change colour when pressure is applied. The formulation of the photopolymer composition (B) is shown in Table 1 in Example 1 below. In both pictures in FIG. 1, it can be seen that the areas of the hologram to which the pressure was applied reconstruct image regions which are changed in colour. It is clearly seen that the application of pressure of 44 N/cm$^2$ leads to change of colour from red to yellow (the yellow area is labeled as 1) in FIG. 1a. A further increase in pressure such as the increase of the pressure to 71 N/cm$^2$ causes change in colour from red to green to blue (the green and blue areas are labeled as 2 and 3 respectively), as shown in FIG. 1b.

Figure 2:
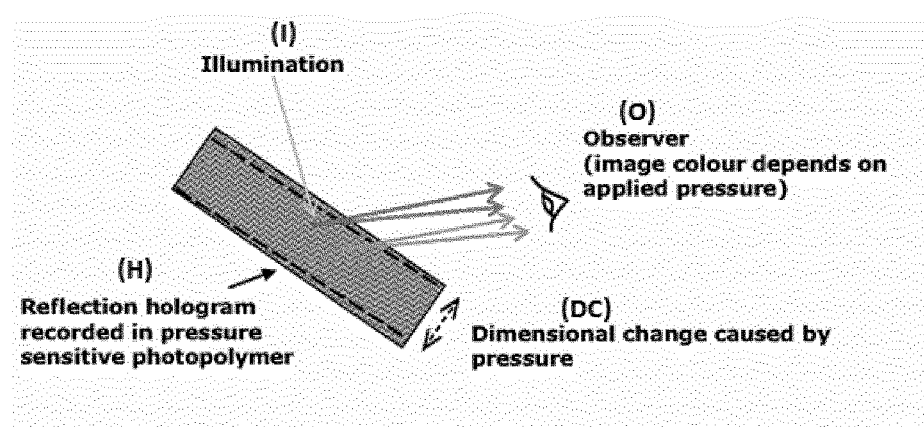
FIG. 2 is a diagram illustrating the principle of operation of a holographic pressure sensor recorded in a photopolymer layer.

The holographic recording compositions of the present invention described herein allow a change in colour to be achieved using mechanical contraction or expansion of the hologram. Pressure sensitive photopolymers are compressed due to applied pressure, which causes a decrease in the recorded fringe spacing of the hologram, and consequently changes the colour of the image reconstructed from the hologram, as shown in FIG. 2. The colour changes from red to yellow to green to blue as the applied pressure increases. The reverse is true when the hologram expands (i.e. pressure is reduced or removed entirely), causing the recorded fringe spacing to increase.

The colour changes after applying pressure. This has the advantage of enabling direct visualisation of pressure distribution as a colour map.

The inventors have found that the combination of Diacetone-acrylamide (N-(1,1-Dimethyl-3-oxobutyl)acrylamide) and citric acid in the compositions according to the present teaching produce holographic recording material capable of recording bright reflection holograms having diffraction efficiency of 38±2%.

The role of the photosensitive dye in the photosensitive layer is to absorb light and start the photochemical process that leads to holographic recording. The dye may be selected from the group consisting of methylene blue dye, erythrosine B, fluorescein, Acryflavin, Rose Bengal, Eosin Y, and all other xanthene dyes.

An infrared photosensitive dye may be included in the composition according to the present teaching. For example, an infrared photosensitive dye could be included in the composition described herein in order to provide a composition capable of recording a hologram in the infrared, which at elevated pressure, reconstructs an image in the visible part of the spectrum. Suitable infrared dyes include the indocyanine green and IR-820 dyes. Thus an invisible image reconstructed from the hologram is rendered visible by applying pressure. In another embodiment a visible holographic image could be made invisible by applying pressure, for example by starting with a blue hologram and applying pressure so that the reconstruction is tuned to UV wavelengths, and therefore no longer visible to the naked eye.

The present teaching provides a holographic recording composition wherein the material is compatible with dye deposition printing techniques as described in [3], such that the dry layer is sufficiently permeable to allow a sensitizing dye applied to the surface of the unsensitized photopolymer to penetrate to a depth suitable for formation of an efficient hologram upon exposure, within a time period compatible with commercial production.

Other methods may also be employed in order to choose the initial colour and or visibility of the hologram. These include swelling or shrinking the recording medium before, during or after holographic recording by any means such as for example, using humidity, pressure, temperature or chemical treatments in order to produce a specific recorded fringe spacing in the sensor device.

The composition according to the present teaching could be used to produce pseudo colour holograms. For example, applying different pressure to different areas of the hologram produces multicolour images. The change in the colour could be achieved using mechanical expansion of the hologram (for example using thermal or chemical means). The colour then changes in the opposite direction to that when applying pressure. For example, if the colour before expansion is orange, after expansion it is red or infrared. A change in colour is also noticeable after mechanical expansion of the hologram.

Pseudo colour holograms can be produced by applying different pressures to different regions in a way that may control both the colours visible and the spatial pattern of those colours in a way that renders text or images or artwork visible to the observer.

Pseudo colour holograms can be produced by applying different pressures to different regions in a way that may control both the colours visible and the spatial pattern of those colours in a way that renders holographic text or images or artwork or displays visible to the observer in a reversible way so that the colour and pattern may be repeatedly varied by local pressure control.

In the diacetone acrylamide-based holographic recording compositions described herein, the pressure sensitivity is provided by the diacetone acrylamide monomer. The diacetone acrylamide monomer also has the advantage of having low toxicity. The reduced toxicity and environmental impact of diacetone acrylamide in comparison to the well-known monomer, acrylamide, has been presented elsewhere [5]. Mihaylova et al have described the use of photopolymers to record reflection holograms which can be used for pressure sensing applications [6], however, the diffraction efficiency of these holographic devices is less than 10%, and therefore is considered too low for use as visual pressure sensors or indicators.

Figure 3:
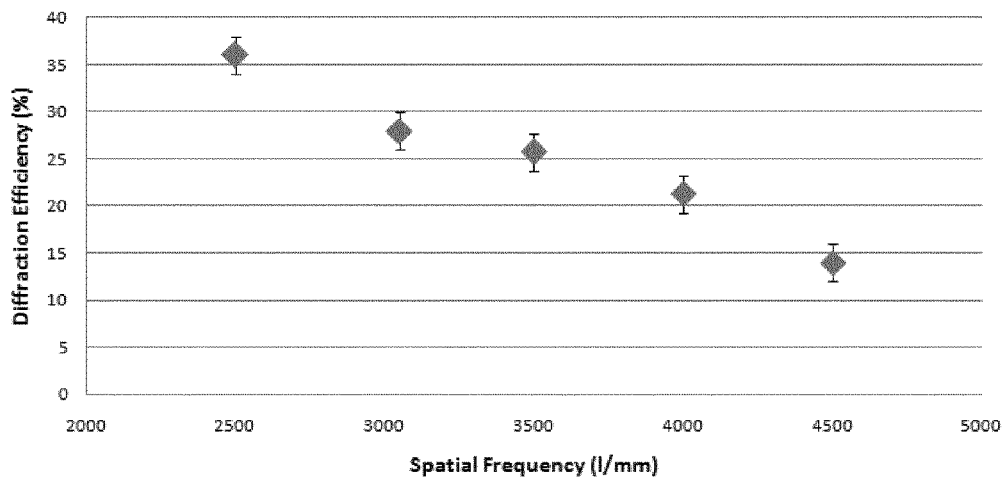
FIG. 3 is a graph showing diffraction efficiency (%) vs. spatial frequency of recording for reflection holograms recorded in the DAG_CA2 composition. This composition is set out in Table 2 and includes Diacetone Acrylamide (DA), Glycerol (G) and Citric acid (CA), the latter in a concentration of 2.45% w/w.

The diffraction efficiency is typically low for reflection mode holograms. Citric acid, in combination with glycerol, acts to increase the diffraction efficiency of the recorded holograms. The citric acid acts as a chain transfer agent. It restricts the growth of long polymer chains within the bright fringes during holographic recording by terminating the growing polymer chain and starting a new polymer chain. The restriction of chain length and mobility is helpful for obtaining high spatial resolution of the material required for obtaining high diffraction efficiency reflection holograms. However in binders with high permeability, the relatively short polymer chains can diffuse from bright to dark fringes and thus smear the created refractive index modulation so it is essential to restrict their mobility by choosing a binder with lower permeability. Glycerol acts as a free radical scavenger in the composition [7-11]. As a free radical scavenger, Glycerol terminates active polymer chains and thus restricts the possibility of free radicals to continue growing in the dark fringe regions and cause polymerisation there. Cody et al report in [7] that glycerol may also function as a plasticizer within photopolymer compositions to aid diffusion of the smaller monomer molecules. The observed increase of the diffraction efficiency at high spatial frequency reveals that the short polymer chain mobility is not affected significantly. The inventors have found that both citric acid and glycerol are necessary in order to record high diffraction efficiency holograms in reflection mode in the diacetone acrylamide-based photopolymer. The combined effect of glycerol and citric acid is to increase the diffraction efficiency of the recorded holograms from 10±2% (for compositions comprising either glycerol or citric acid) to 28±2% at a spatial frequency of 3050 l/mm. Holograms prepared using the composition according to the present teaching suitably have a diffraction efficiency in the range 28-38% for spatial frequencies in the range 2500-3500 l/mm. The maximum diffraction efficiencies achievable in this composition for the range of spatial frequencies of 2500-4500 l/mm are shown in FIG. 3.

FIG. 2 is a diagram illustrating the principle of operation of a holographic pressure sensor recorded in a photopolymer layer. An illumination source (I) is focused on a reflection hologram (RF) recorded in pressure sensitive photopolymer. An observer (O) can observe a change in the colour of the reconstructed image, the colour change depending on the extent of the applied pressure. The dimensional change (DC) is also indicated in FIG. 2, the dimensional change being caused by the change in pressure.

Figure 12:
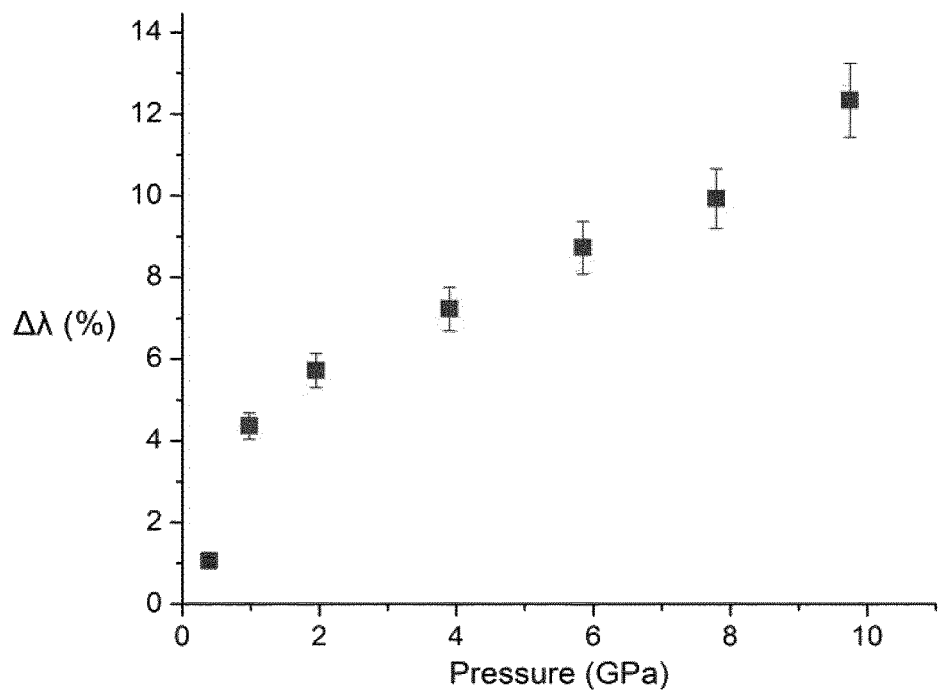
FIG. 12 is a graph showing the percentage change in reconstructed wavelength (Δλ) of a reflection grating recorded in the DAG_CA2 composition as a function of the pressure applied, given in GPa. The reading is taken within 15 minutes after the application of pressure.
Figure 14:
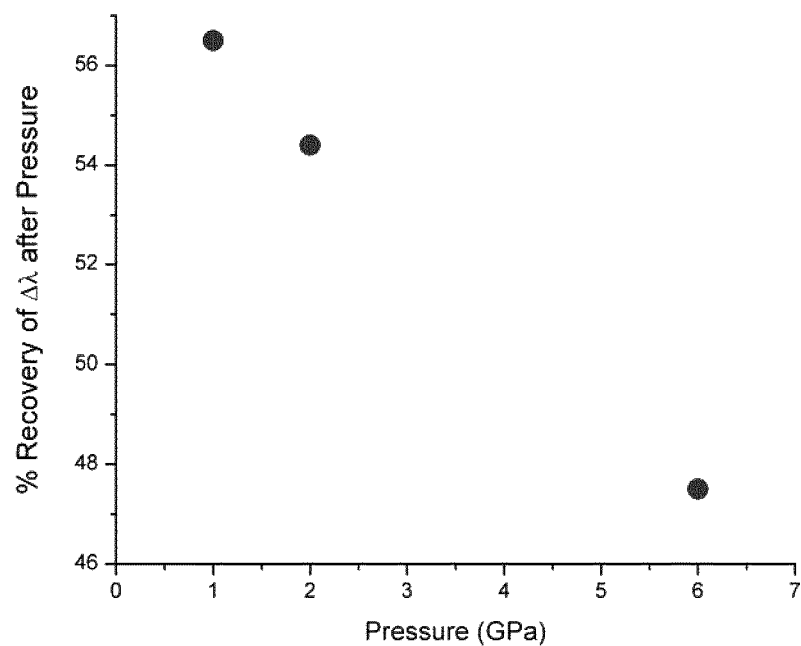
FIG. 14 is a graph showing the percentage recovery of the change in reconstructed wavelength (Δλ) from a Denisyuk-type reflection hologram recorded in the DAG_CA2 composition for a range of applied pressures (GPa), 48 hours after pressure has been applied.
Figure 15:
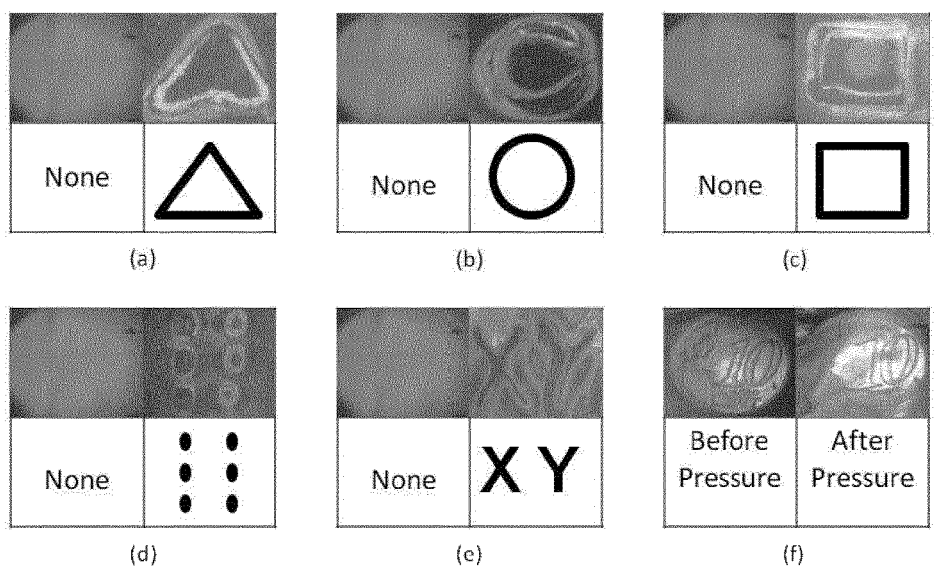
FIG. 15 is a series of images of Denisyuk-type reflection holograms both before and after the application of pressure using (a) a triangular-shaped stamp, (b) a circular-shaped stamp, (c) a square-shaped stamp, (d) a six-pronged stamp and (e) a stylus to write the letters X and Y. Shown in (f) is a Denisyuk-type reflection hologram of a coin (which is a Euro-zone 10 cent (10c) coin) before and after application of pressure.

The colour of the image reconstructed from a reflection hologram recorded in the diacetone acrylamide, glycerol and citric acid-based holographic recording compositions described herein, changes due to the application of pressure. The extent of the shift in reconstructed wavelength depends on the pressure applied, as shown in FIG. 12. Changes in reconstructed wavelength of up to 12% have been demonstrated for applied pressures of up to 10 GPa. Using the compositions of the present invention—the change in hologram colour due to the application of pressure is reversible by up to 56% in the 48 hours after application of pressure for the range of pressures tested as shown in FIG. 14. Pressure can be applied to the reflection holograms to produce a visible colour change in a variety of different ways such as with differently shaped stamps, a stylus or simply a finger, as shown in FIG. 15.

EXAMPLES

The invention will be described in more detail below with reference to the Examples.
Experimental:

Example 1: Investigation of the Effect of Pressure on the Colour of Images Reconstructed from Holograms Recorded in Different Diacetone Acrylamide-Based Compositions Containing No Citric Acid A. Preparation of Diacetone Acrylamide (DA) Photopolymer Compositions Three different pressure-sensitive photopolymer (PSP) compositions were prepared as outlined in Table 1. None of the compositions tested contain citric acid.

B. Experimental Set-Up

Figure 4:
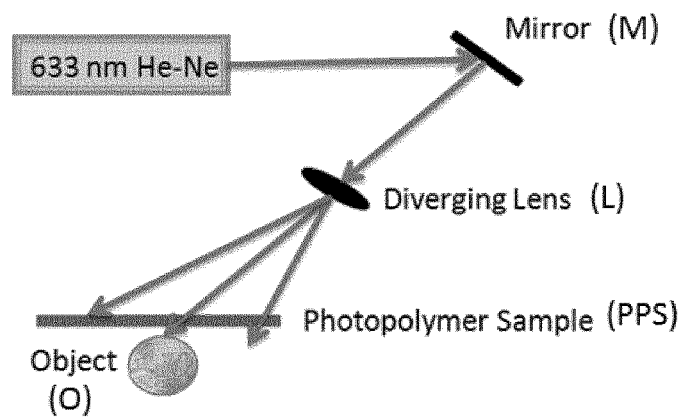
FIG. 4 is an experimental setup used for the recording of Denisyuk-type reflection holograms of a coin in photopolymer layers.

With reference to FIG. 4, a 633 nm He—Ne laser was used to record Denisyuk-type reflection holograms. Different pressures were then exerted on the recorded holograms using an indenter. FIGS. 5(a), (b) and (c) show images reconstructed from the holograms and captured directly after pressure was applied to the holograms using an Instron indenter. The pressure applied to each hologram is given underneath each image.

TABLE 1

% Solid Weight of Photopolymer Composition Components for Denisyuk Hologram Recording

|  | Composition A | Composition B | Composition C |
|---|---|---|---|
| PVA (10% wt/vol) (% w/w) | 33.92 | 32.82 | 36.60 |
| Diacetone Acrylamide (% w/w) | 11.88 | 16.41 | 18.30 |
| Bisacrylamide (% w/w) | 5.09 | 3.28 | 3.66 |
| Triethanolamine (% w/w) | 38.34 | 37.08 | 41.36 |
| 0.11% w/vol Methylene Blue Dye (% w/w) | 0.08 | 0.07 | 0.07 |
| Glycerol (% w/w) | 10.69 | 10.34 | — |
| Diffraction Efficiency (%) | 5.0 | 5.1 | 5.2 |

Figure 5:
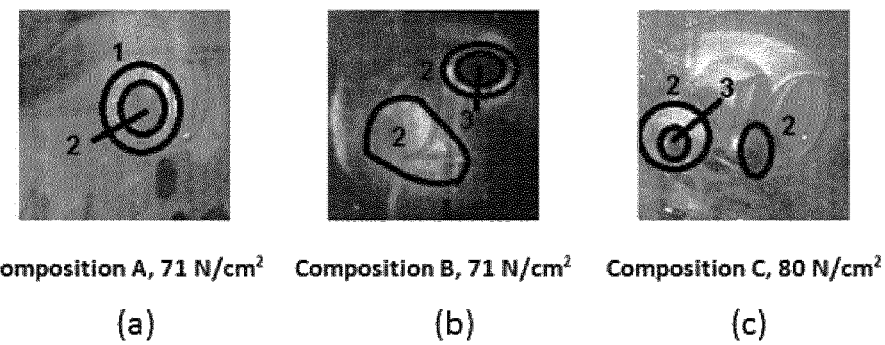
FIGS. 5(a), (b) and (c) is a series of images reconstructed from holograms recorded in the photopolymer compositions outlined in Table 1; Pressure has been applied to all of the holograms using an Instron indenter and a change in colour of the image reconstructed from the hologram is visible as a result of the applied pressure. The parts of the image reconstructed from the hologram indicated by reference numerals 1, 2 and 3 are coloured yellow, green and blue respectively, due to the application of increased levels of pressure applied at each respective location 1, 2 and 3. The specific pressures applied are given under each of FIGS. 5(a), (b) and (c) which are, respectively, 71 N/cm$^2$, 71 N/cm$^2$ and 80 N/cm$^2$.

All compositions successfully recorded Denisyuk-type holograms. However the diffraction efficiency of these gratings was low (approximately 5% for these compositions. Proof of concept of the pressure sensitivity of this diacetone acrylamide-based photopolymer material was demonstrated however. As shown in FIG. 5, as the pressure applied to the hologram was increased, the colour of the reconstructed image changed from red to yellow (areas labeled 1) to green (areas labeled 2) to blue (areas labeled 3).

Example 2: Investigation of the Ability of the Holographic Recording Compositions Comprising Diacetone Acrylamide (DA) Photopolymer, Citric Acid and Glycerol, to Record High Diffraction Efficiency Reflection Mode Holograms A. Preparation of DA Composition and Photopolymer Layers Containing Citric Acid and Glycerol The different compositions tested were prepared as described in Table 2 below. 0.5 ml of the photopolymer solution was then deposited on to glass slides (76×26 mm) and allowed to dry for 12-24 hours in darkness under normal laboratory conditions (20-25° C., 40-60% RH).

B. Experimental Set-Up

Figure 6:
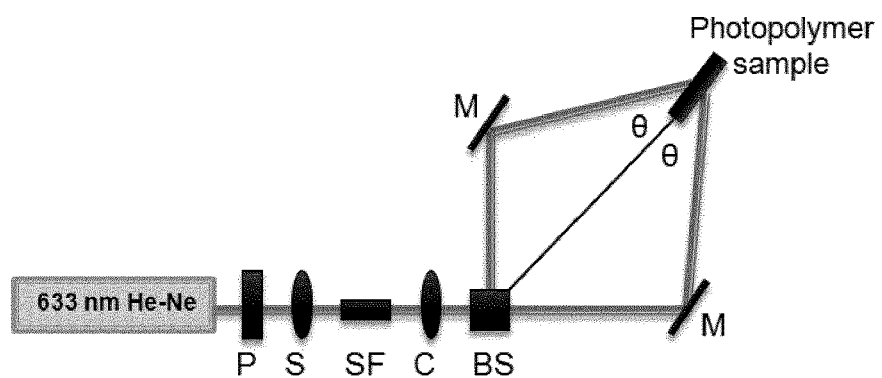
FIG. 6 is an experimental setup used for the recording of holographic reflection gratings in photopolymer layers P: polariser, S: shutter, BS: beam splitter, SF: spatial filter, C: collimator, M: mirror.

A two-beam holographic optical setup as depicted in FIG. 6 was used to record reflection gratings at a spatial frequency of 3050±10 l/mm)(θ=40°) using a 633 nm He—Ne laser. Reflection gratings were recorded in the layer using total exposure energy of 255 mJ/cm$^2$, with total recording intensity of 3.2 mW/cm$^2$.

TABLE 2

% Solid Weights of the Diacetone Acrylamide (DA) Reflection Mode Compositions

|  | DA0 | DAG | DAG_CA1 | DAG_CA2 | DAG_CA3 |
|---|---|---|---|---|---|
| PVA (10% wt/vol) (% w/w) | 36.68 | 29.80 | 24.78 | 24.47 | 24.18 |
| Triethanolamine (% w/w) | 41.23 | 33.49 | 27.85 | 27.51 | 27.17 |
| Diacetone Acrylamide (% w/w) | 18.34 | 14.90 | 12.39 | 12.24 | 12.09 |
| Bisacrylamide (% w/w) | 3.67 | 2.98 | 2.48 | 2.45 | 2.42 |
| Citric Acid (% w/w) | — | — | 1.24 | 2.45 | 3.63 |
| 0.11% w/vol Methylene Blue Dye (% w/w) | 0.08 | 0.07 | 0.05 | 0.05 | 0.05 |
| Glycerol (% w/w) | — | 18.77 | 31.22 | 30.84 | 30.46 |
| Diffraction Efficiency (%) | 10 | 10 | 14 | 28 | 26 |

Figure 7:
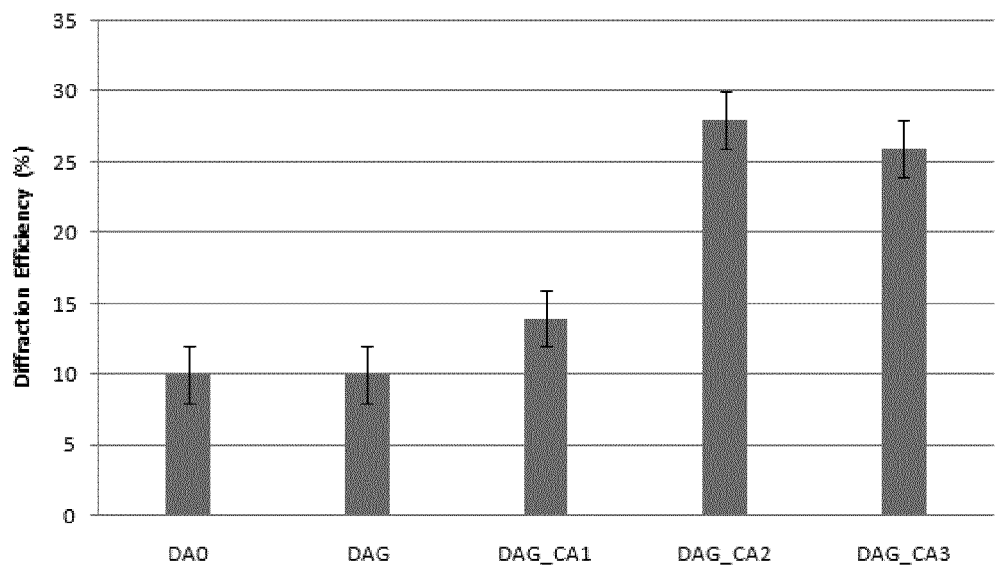
FIG. 7 is a graph showing the diffraction efficiency values achieved for reflection gratings recorded with the different diacetone acrylamide-based compositions described in Table 2.

A composition comprising diacetone acrylamide (DA) was prepared without glycerol (G) or citric acid (CA) and this composition is denoted as DA0; other compositions were also prepared comprising diacetone acrylamide (DA) and the additive, glycerol (G), with no citric acid, this composition being denoted as DAG); and further compositions (denoted as DAG_CA1, DAG_CA2 DAG_CA3) comprising diacetone acrylamide (DA), Glycerol (G) and citric acid (CA), were studied. The effect of citric acid on the holographic recording ability of the diacetone acrylamide photopolymer was also investigated for different concentrations using the compositions DAG_CA1, DAG_CA2 DAG_CA3. The results from these experiments are shown in FIG. 7.

Diffraction efficiency values of approximately 10% were achieved with the DA0 and DAG photopolymer compositions. It was observed that the addition of citric acid to the photopolymer composition increases the diffraction efficiency nearly threefold to 28±2%, for an optimum citric acid concentration of 2.45% w/w. As the concentration of citric acid is increased above this, the uniformity of the photopolymer layers is degraded due to increased surface tension. However this may be improved with the addition of a surfactant such as Kodak Photo-flo solution.

Example 3: Investigation of the Effect of Glycerol and Citric Acid on the Recording of High Diffraction Efficiency Reflection Mode Gratings A. Preparation of DA Composition and Photopolymer Layers Three photopolymer solutions, denoted as compositions A, B and C, respectively, were prepared as outlined in Table 3. The DAG_CA2 composition (composition A), the DAG_CA2 composition without Glycerol (composition B), and the DAG_CA2 composition without Citric Acid (composition C). This was done in order to investigate which photopolymer component, Glycerol or Citric Acid, is responsible for the enhancement of the maximum achievable diffraction efficiency. 0.5 ml of the photopolymer solution was then deposited on to glass slides (76×26 mm) and allowed to dry for 12-24 hours in darkness under normal laboratory conditions (20-25° C., 40-60% RH).

B. Experimental Set-Up

The experimental set-up was the same as for Example 2.

TABLE 3

% Solid Weight of Photopolymer Composition Components

|  | Composition A: Citric Acid + Glycerol | Composition B: no Glycerol | Composition C: no Citric Acid |
|---|---|---|---|
| PVA (10% wt/vol) (% w/w) | 24.47 | 35.38 | 29.80 |
| Triethanolamine (% w/w) | 27.51 | 39.77 | 33.49 |
| Diacetone Acrylamide (% w/w) | 12.24 | 17.69 | 14.90 |
| Bisacrylamide (% w/w) | 2.45 | 3.54 | 2.98 |
| Citric Acid (% w/w) | 2.45 | 3.54 | — |
| 0.11% w/vol Methylene Blue Dye (% w/w) | 0.05 | 0.08 | 0.07 |
| Glycerol (% w/w) | 30.84 | — | 18.77 |
| Diffraction Efficiency (%) | 28 | 10 | 10 |

Figure 8:
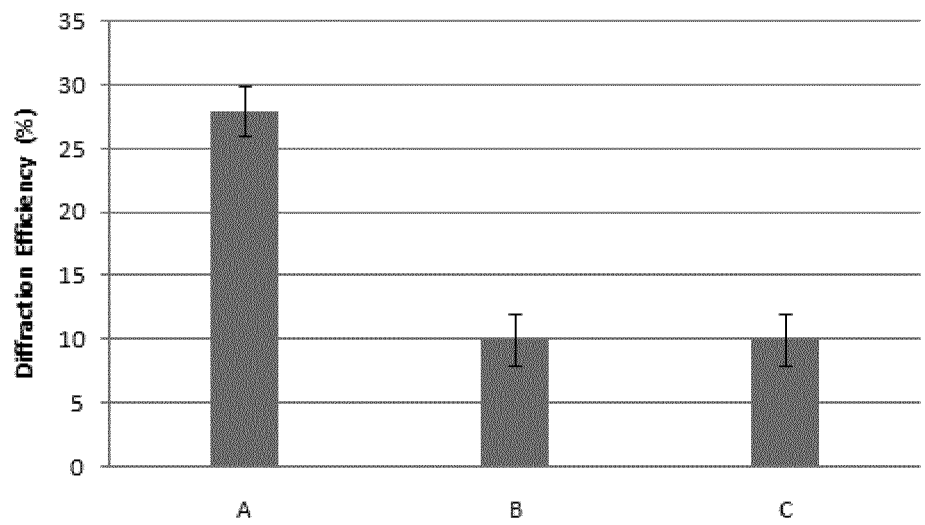
FIG. 8 is a graph showing the diffraction efficiency values achieved for reflection gratings recorded with the different diacetone acrylamide-based compositions described in Table 3.

The maximum diffraction efficiency achieved for each composition is shown in FIG. 8. For composition A, diffraction efficiencies of up to 28±2% were observed. For compositions B and C, the highest diffraction efficiency observed in both cases was approximately 10±2%. The results in FIG. 8 demonstrate that the composition comprising citric acid in the absence of glycerol is capable of recording reflection holograms having a diffraction efficiency of up to 10±2%. The results also demonstrate that the holographic recording composition which comprises glycerol in the absence of citric acid is capable of recording diffraction efficiency reflection holograms of up to 10±2%.

These results indicate that both glycerol and citric acid are required in order to achieve high diffraction efficiency reflection mode gratings. It is known that with increasing monomer concentration, the diffraction efficiency increases. As seen in Table 2, the concentration of the two monomers, Diacetone Acrylamide (DA) and Bisacrylamide varies in the three compositions, and it is lowest in composition A. Thus the increased diffraction efficiency cannot be attributed to variation in the monomer concentration and can only be ascribed to the presence of both Citric Acid and Glycerol.

Example 4: Optimisation of the Holographic Recording Conditions for Recording of Reflection Holograms in the DAG_Ca2 Holographic Recording Composition A. Preparation of DA Composition and Photopolymer Layers The DAG_CA2 holographic recording composition and samples were prepared as described in Example 2.

B. Experimental Set-Up

Figure 9:
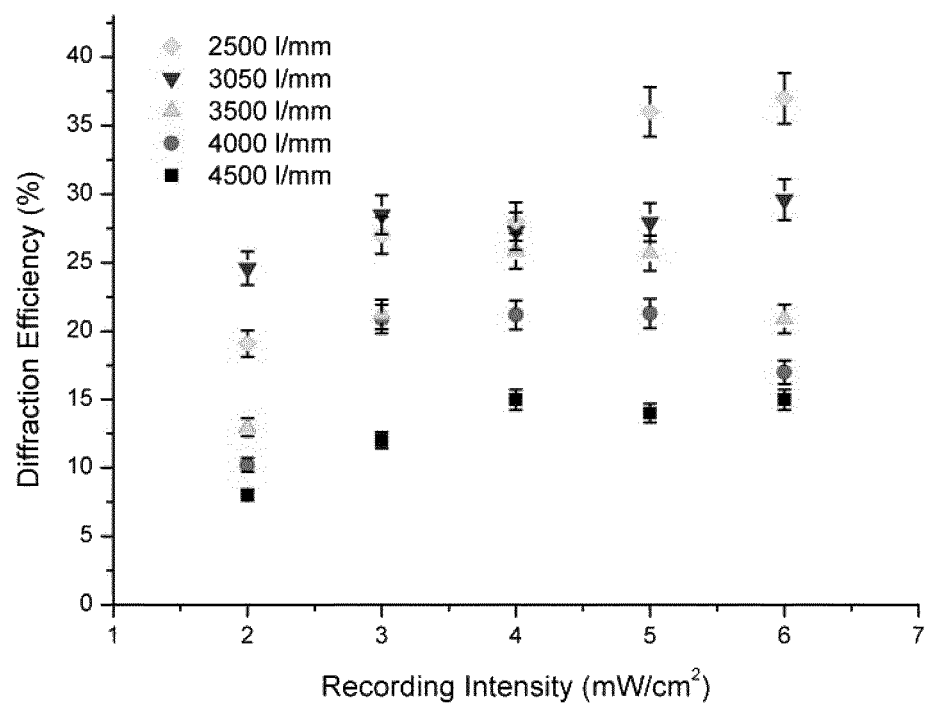
FIG. 9 is a graph showing diffraction efficiency (%) vs. recording intensity (mW/cm$^2$) for reflection holograms recorded in the DAG_CA2 composition, detailed in Table 2, for spatial frequencies in the range of 2500-4500 l/mm.

A two-beam holographic optical setup as depicted in FIG. 6 was used to record reflection gratings using a 633 nm He—Ne laser. The effect of the laser recording intensity on the diffraction efficiency of the recorded reflection gratings was investigated by recording gratings using intensities of between 2 and 6 mW/cm$^2$. Total recording exposure energy of 270 mJ/cm$^2$ was used for each recording intensity. The results of this study are shown in FIG. 9. The effect of the spatial frequency of the recording geometry on the diffraction efficiency was also investigated by varying the angle between the recording beams, producing spatial frequencies in the range of 2500 to 4500 l/mm. This allows for the identification of the optimum recording intensity and recording spatial frequency for the DAG_CA2 holographic recording composition.

From FIG. 9 it is observed that the diffraction efficiency of the reflection holograms recorded in the DAG_CA2 composition is maximised when using recording intensities in the range of 4 to 6 mW/cm$^2$. This is shown to be the case for all recording geometry spatial frequencies from 2500 to 4500 l/mm. Maximum diffraction efficiency values of 25 to 37% are obtained for spatial frequencies of 2500 to 3500 l/mm. Reflection gratings with diffraction efficiency of 15 to 20% are obtained for spatial frequencies of 4000 to 4500 l/mm.

Example 5: Using Ultraviolet (UV) Light to Fix the Pressure-sensitive Holograms Recorded in the Diacetone Acrylamide Photopolymer B. Preparation of DA Composition and Photopolymer Layers The DAG_CA2 holographic recording composition and samples were prepared as described in Example 2.

B. Experimental Set-Up

Reflection holographic gratings were recorded as described in Example 2. A nanosecond pulsed 355 nm UV laser was used to bleach the remaining dye in the photopolymer layers directly after recording, thereby fixing the hologram recorded. A repetition rate of 11 Hz was observed to be optimum. Layers were bleached for durations of approximately 3 minutes, during which time the samples were completely bleached in the illuminated area. The power per unit area of the laser illumination was approximated to be 150 mW/cm$^2$. Diffraction efficiencies of the gratings were measured directly after UV fixing to be 20±2%. An initial decrease in diffraction efficiency was observed due to the delay time between holographic recording and UV post exposure. This can be improved by reducing the delay time.

Figure 10:
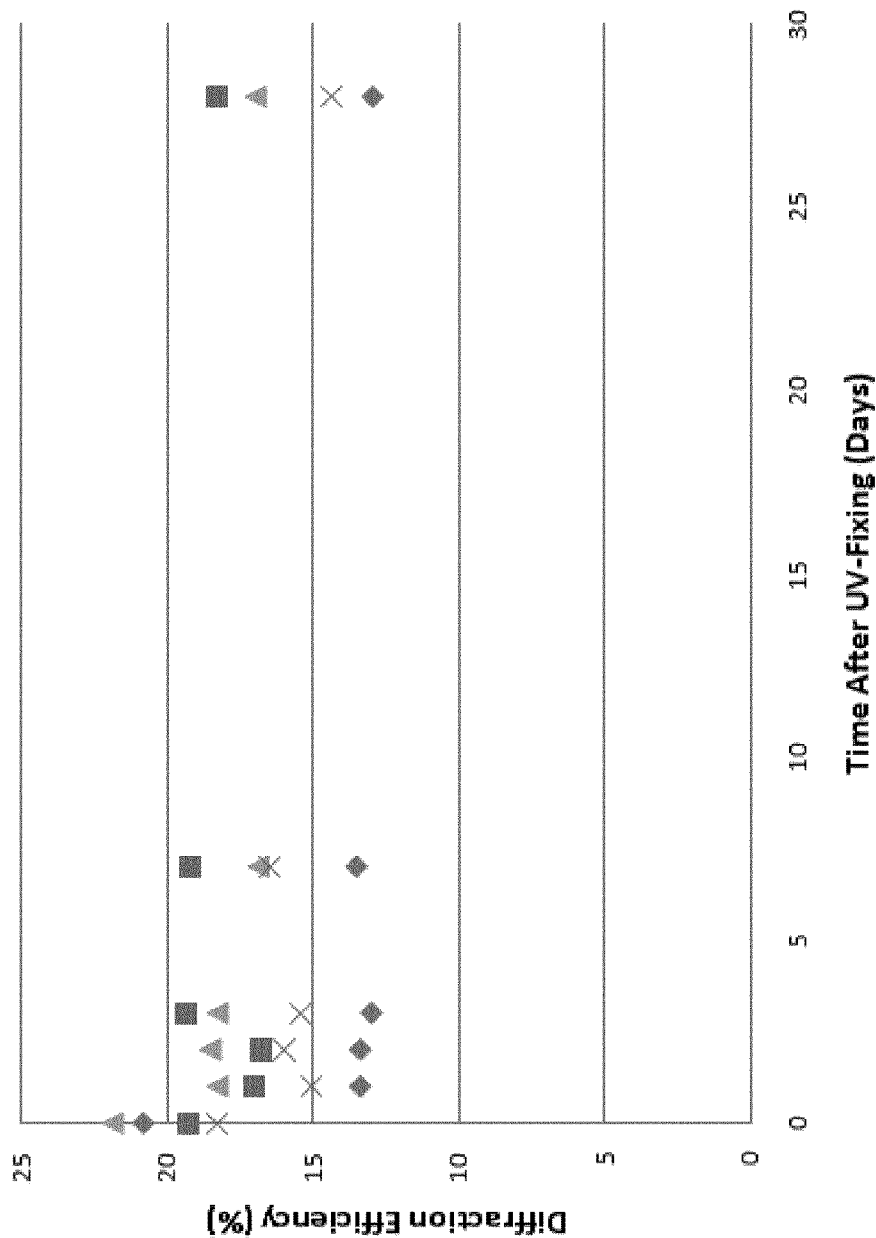
FIG. 10 is a graph showing diffraction efficiency (%) vs. time after UV-Fixing (days) for reflection holograms recorded in the DAG_CA2 composition, detailed in Table 2.

A shelf life study was carried out for one month after recording to investigate the life-time of the holograms after UV fixing. The results of this study are shown in FIG. 10.

An initial decrease of approximately 4% in diffraction efficiency was observed to occur for all holograms in the first 24 hours after UV-fixing. These holograms were not laminated or covered in any way, and therefore were subject to external influences such as humidity and temperature, which explains the observed decrease. This decrease can be prevented by lamination of the holograms. After this initial decrease, no further significant decrease in diffraction efficiency was observed over a 28-day period. The holograms were sensitive to pressure after UV-fixing.

Example 6: Investigation of the Effect of Pressure on the Wavelength of Reconstructed Holograms Recorded in the Diacetone Acrylamide Photopolymer A. Preparation of DA Photopolymer-Based Reflection Gratings The DAG_CA2 holographic recording composition and samples were prepared as described in Example 2. Reflection holographic gratings were recorded as described in Example 2. The photopolymer layers were then bleached as described in Example 5, thereby fixing the hologram recorded. The photopolymer samples were laminated with a 50 μm thick Melinex® 401 polyester film in order to protect the recorded gratings when applying pressure.

B. Experimental Set-Up to Apply Quantified Pressure to the Holographic Reflection Gratings Pressure was applied to the reflection gratings using an Instron Series 5569 Tensile Tester. Merlin v. 5.31 software was used to control the downward force applied to the samples.

Figure 11:
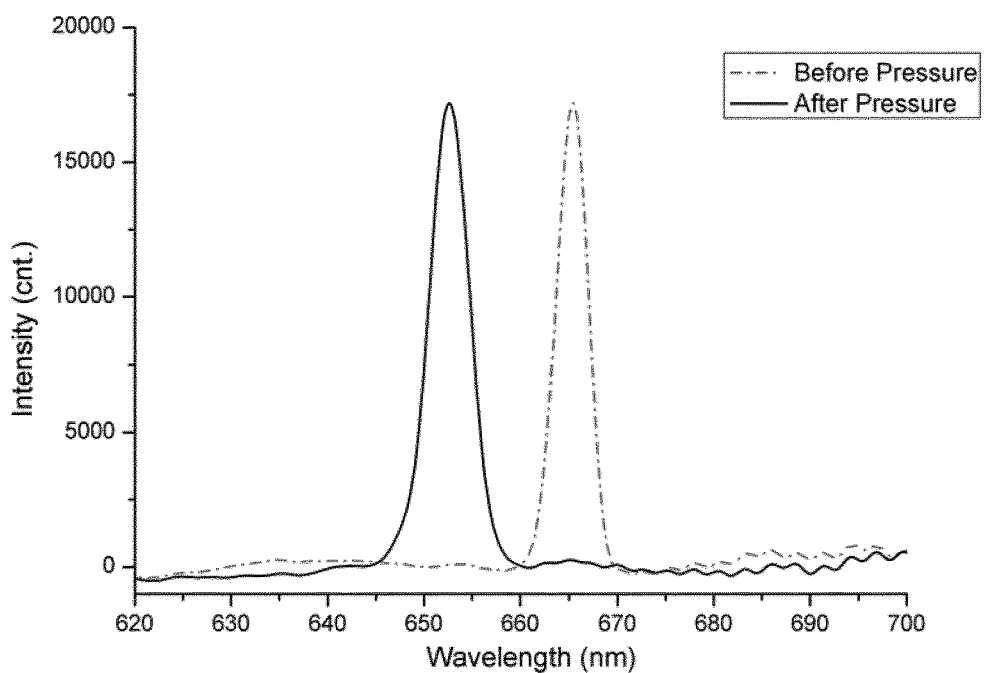
FIG. 11 is a graph showing the peak reconstructed wavelength of a reflection grating recorded in the DAG_CA2 composition before and within 15 minutes after the application of pressure.

C. Experimental Set-Up to Measure the Shift in the Reconstructed Wavelength of the Reflection Gratings Due to Applied Pressure A Horiba Jobin Yvon confocal Raman spectrometer was used with a broadband white light source, therefore allowing the collection of a wide spectrum as a function of wavelength. The reconstructed wavelength from the holographic reflection grating when illuminated with white light was thus measured. FIG. 11 shows an example of the change in the position of the reconstructed wavelength peak from the reflection hologram before and after the application of pressure, measured using the Raman method.

The percentage change in reconstructed wavelength ($\Delta\lambda$) from a reflection holographic grating due to application of pressure is shown in FIG. 12 for pressures ranging from 0.4 to 10 GPa. As pressure is increased, the change in reconstructed wavelength $\Delta\lambda$ increases from 1 to 12% in comparison to the original reconstructed wavelength.

Example 7: Investigation of the Reversibility of the Effect of Pressure on the Reconstructed Wavelength of the Reflection Holograms Recorded in the Diacetone Acrylamide Photopolymer A. Preparation of DA Photopolymer-Based Reflection Gratings The holographic reflection gratings for this study were prepared as described in Example 6.

B. Experimental Set-Up

The same experimental techniques as described in Example 6 were used to apply quantified pressure and to monitor the effect of pressure on the wavelength of the light reconstructed from the hologram.

Figure 13:
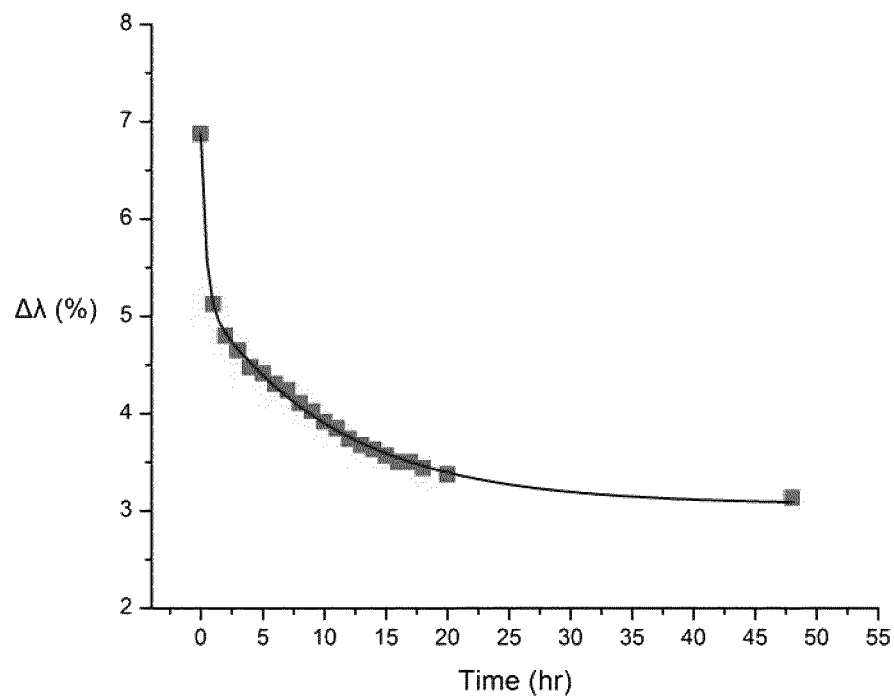
FIG. 13 is a graph showing the percentage change in reconstructed wavelength (Δλ) of a reflection grating recorded in the DAG_CA2 composition as a function of Time (hr) after a pressure of 2 GPa has been applied.

In order to investigate the reversibility of effects of pressure on the wavelength of the light reconstructed from the hologram, the change in wavelength ($\Delta\lambda$) was monitored over a period of 48 hours after the application of pressure. This was done for three different pressures: 1, 2 and 6 GPa. An example of the data obtained is shown in FIG. 13 for a pressure of 2 GPa. The percentage change in reconstructed wavelength is shown in FIG. 14 for the different applied pressures. Reversibility of the change in reconstructed wavelength of up to 56% 48 hours after the application of pressure is observed.

Example 8: Demonstration of Visible Colour Change in Reconstruction from Diacetone Acrylamide Photopolymer-Based Reflection Holograms Due to the Application of Pressure A. Preparation of Denisyuk-Type DA Photopolymer-Based Reflection Holograms The DAG_CA2 holographic recording composition and samples were prepared as described in Example 2. With reference to FIG. 4, a 633 nm He—Ne laser was used to record Denisyuk-type reflection holograms in the diacetone acrylamide photopolymer. A mirror was used as the object in order to obtain a uniformly red reconstructed image. In one instance, a 10 cent coin was used as the object.

B. Experimental Set-Up

Pressure was manually applied to the Denisyuk-type reflection holograms using a range of differently-shaped stamps, as shown in FIG. 15(a)-(d). In the regions where pressure has been applied, a clear change in colour of the reconstructed light is visible from the original red colour to orange, yellow, green and blue, with increasing pressure. A stylus was used to write the letters X and Y on the grating surface as shown in (e). This technique was also proven to cause a visible change in colour of the reconstructed light . . . . Finally, a Denisyuk-type hologram was recorded of a 10 cent coin, as shown in (f). The application of pressure to this hologram resulted in a visible change in colour.

The words comprises/comprising when used in this specification are to specify the presence of stated features, integers, steps or components but does not preclude the presence or addition of one or more other features, integers, steps, components or groups thereof.

REFERENCES

[1] S. Martin, I. Naydenova. V. Toal, V. Farrelly, "A holographic method and sensor", Patent number: GB2439746 A (2008).

[2] I. Naydenova, S. Martin, V. Toal, "Photopolymers: Beyond the Standard Approach to Photosensitisation", Journal of the European Optical Society, Rapid Publications, 4, 09042, 2009.

[3] S. Martin, I. Naydenova. V. Toal, "Method of making a reflection hologram and a reflection hologram", Patent number: U.S. Pat. No. 8,440,370 B2 (2013).

[4] K. A. Rodrigues, M. M. Vanderhoof, A. M. Carrier, J. Sanders, "Hybrid copolymer compositions", Patent number: US20120128608 A1 (2012).

[5] D. Cody, A. Casey, I. Naydenova, E. Mihaylova, "A Comparative Cytotoxic Evaluation of Acrylamide and Diacetone Acrylamide to Investigate Their Suitability for Holographic Photopolymer Formulations", International Journal of Polymer Science, 564319 (2013).

[6] E. Mihaylova, D. Cody, I. Naydenova, S. Martin, V. Toal, "Research on Holographic Sensors and Novel Photopolymers at the Centre for Industrial and Engineering Optics", Holography: basic principles and contemporary applications, Intech (2013).

[7] D. Cody, I. Naydenova, E. Mihaylova, "Effect of glycerol on a diacetone acrylamide-based holographic photopolymer material", Applied Optics 52(3), 489-494 (2013).

[8] X. Ren, Z. Yang, T. Kuang, "Solvent-induced changes in photochemical activity and conformation of photosystem 1 particles by glycerol," Biol. Chem. Hoppe-Seyler 387, 23-29 (2006).

[9] C. W. Bennett, "Glycerol as sensitizer," J. Phys. Chem. 16, 614-615 (1912).

[10] T. Meyer, G. Tollin, J. Hazzard, and M. Cusanovich, "Photoactive yellow protein from the purple phototropic bacterium," Biophys. J. 56, 559-564 (1989).

[11] L. Galassi, "Wavelength dependence of the time course of fluorescence enhancement and photobleaching during irradiation of ethidium bromide-stained nuclei," Eur. J. Basic Appl. Histochem. 44, 419-432 (2000).

The invention claimed is:

1. A holographic recording composition comprising diacetone acrylamide, citric acid, and glycerol.

2. The holographic recording composition as claimed in claim 1, wherein the holographic recording composition is a pressure sensitive holographic recording composition, wherein a colour change occurs in the image reconstructed from a hologram recorded in the composition in response to a change in pressure applied to the composition.

3. The holographic recording composition as claimed in claim 2, wherein sensitivity to change in pressure is manifested by a change in the wavelength of a reconstructed light from a reflection hologram recorded in such composition.

4. The holographic recording composition as claimed in claim 1, which is configured to record pressure sensitive holograms having a diffraction efficiency in the range 25% to 40% when recorded at a spatial frequency in the range of 2500 l/mm to 3500 l/mm.

5. The holographic recording composition as claimed in claim 1, further comprising a photoinitiator and a binder.

6. The holographic recording composition as claimed in claim 5, wherein the free radical generator is selected from the group consisting of triethanolamine (TEA), Diethanolamine (DEA), Ethanolamine (EA), Trethlyamine (TETN), Diethylamine (DETN), and Ethylenediaminetetraacetic acid (EDTA).

7. The holographic recording composition according to claim 6, wherein the triethanolamine is present in an amount in the range of 20% w/w to 45% w/w.

8. The holographic recording composition as claimed in claim 5, wherein the binder is selected from the group of hydrogels consisting of polyvinylalcohol, polyvinylpirrolidone, polyethyleneoxide, polyethyleneglycol, polyethyloxizaline, and a silica sol-gel.

9. The holographic recording composition as claimed in claim 5, wherein the photoinitiator is selected from the group consisting of methylene blue dye, erythrosine B, indocyanine green, Ethyl Eosine, Eosin Scarlet, Eosin Y, Rose Bengal, Phloxine B, Fluorescein, Methyl Blue, xanthene dyes, thionine dyes, and quinine-imine dyes.

10. The holographic recording composition as claimed in claim 1, comprising citric acid in an amount in the range from 0.8% w/w to 6% w/w.

11. The holographic recording composition as claimed in claim 10, comprising diacetone acrylamide in an amount in the range of from 8% w/w to 30% w/w.

12. The holographic recording composition as claimed in claim 1, comprising glycerol in an amount in the range 8% w/w to 35% w/w.

13. The holographic recording composition as claimed in claim 1, further comprising a cross-linking monomer selected from the group consisting of N, N'-methylene bisacrylamide, piperazine di-acrylamide, diallyltartardiamide, and dihydroxyelthylene-bis-acrylamide.

14. The holographic recording composition as claimed in claim 1, wherein the composition is pressure sensitive to pressure up to 6 GPa.

15. The holographic recording composition as claimed in claim 1, which is pressure sensitive in the range of 40 N/cm$^2$ to 110 N/cm$^2$.

16. A hologram recorded using the holographic recording composition according to claim 1.

17. A holographic sensor comprising the holographic recording composition as claimed in claim 1.

18. A security device comprising a hologram recorded from the holographic recording composition as claimed in claim 1.

19. A method of producing a pressure sensitive hologram from the holographic recording composition as claimed in claim 1, comprising holographically recording a reflection hologram of spatial frequency ranging between 2500 l/mm and 4500 l/mm and utilizing recording intensity in the range from about 2 mW/cm$^2$ to about 6 mW/cm$^2$.

20. The method as claimed in claim 19, wherein the composition includes other components selected from any one or more of the group consisting of a dye, a free radical generator, a second monomer or cross linking monomer, and a binder.

* * * * *